United States Patent [19]

Lesko

[11] Patent Number: 5,359,238

[45] Date of Patent: Oct. 25, 1994

[54] ANALOG TO DIGITAL INTERFACE CIRCUIT WITH INTERNAL RESISTANCE COMPENSATION AND INTEGRITY VERIFICATION

[75] Inventor: Alan J. Lesko, Farmington Hills, Mich.

[73] Assignee: Ford Motor Company, Dearborn, Mich.

[21] Appl. No.: 924,818

[22] Filed: Aug. 4, 1992

[51] Int. Cl.⁵ ............... G01B 7/14; G01N 27/72; H03K 5/153
[52] U.S. Cl. .............................. 307/358; 328/162; 324/207.12; 324/225
[58] Field of Search .................. 307/264, 358, 360; 328/162, 165, 167; 324/207.12, 207.25, 225

[56] References Cited

U.S. PATENT DOCUMENTS

| | | | |
|---|---|---|---|
| 4,293,814 | 10/1981 | Boyer | 324/166 |
| 4,532,437 | 7/1985 | Bodig et al. | 307/358 |
| 4,652,774 | 3/1987 | Hasegawa | 307/360 X |
| 4,835,467 | 5/1989 | Gokhale | 324/166 |
| 4,837,508 | 6/1989 | Garnault | 324/166 |
| 4,902,970 | 2/1990 | Suquet | 324/173 |
| 4,914,387 | 4/1990 | Santos | 324/166 |
| 5,002,207 | 4/1991 | Edwards | 324/166 |
| 5,015,878 | 5/1991 | Lasagna et al. | 307/358 |
| 5,030,850 | 7/1991 | Lunsford | 307/358 |
| 5,107,210 | 4/1992 | Shirao et al. | 328/167 X |
| 5,175,748 | 12/1992 | Takahashi | 307/358 X |

FOREIGN PATENT DOCUMENTS 77715 4/1987 Japan ................................ 307/358

Primary Examiner—Willis R. Wolfe
Attorney, Agent, or Firm—Paul K. Godwin; Roger L. May

[57] ABSTRACT

An interface circuit for connecting a signal source [10], such as a variable reluctance sensor, to a digital circuit [20] such as a microprocessor. A comparator [40] generates a logic signal [at 49] indicating whether the signal from the source is greater than or less than the signal's average value. The inputs to the comparator are connected across a pair of back-to-back diodes [44,46] which are serially connected with a current limiting resistor [42] between the source and the output of an operational amplifier [35] which generates an average value voltage. The operational amplifier's output is directly connected to its negative input so that it exhibits unit gain, and the operational amplifier's input is connected to the sensor voltage by a low-pass filter [32,34] so that amplifier responds only to the DC content of the sensor's output signal. A second comparison circuit [50] continuously monitors the average value signal from the operational amplifier and generates a logical fault signal [at 56] whenever that average value signal lies outside a predetermined range of acceptable values.

9 Claims, 1 Drawing Sheet

ANALOG TO DIGITAL INTERFACE CIRCUIT WITH INTERNAL RESISTANCE COMPENSATION AND INTEGRITY VERIFICATION

FIELD OF THE INVENTION

This invention relates generally to electronic sensing systems and more particularly to an arrangement for interconnecting a source of a time-varying signal to a digital utilization circuit.

BACKGROUND OF THE INVENTION

It is frequently necessary to convert time-varying analog signals into digital signals having predetermined voltage levels supplied to logic circuits, microprocessors, and the like. Commonly, analog sensors are interconnected with digital circuits to provide control functions in response to external events detected by the sensors. As an example, digital control systems for vehicles typically respond to a variety of sensors to adaptively control the engine, the heating and ventilating system, and the electrical system.

Variable reluctance sensors are frequently used in automotive systems to detect the position and motion of moving parts, such as the rotating engine crankshaft. These variable reluctance sensors are connected to interface circuits which generate digital timing signals for engine control functions. In these arrangements, a DC current is passed through the sensor and a signal is developed across the sensor which has a DC component and a time-varying component. A comparator is typically used to compare the instantaneous magnitude of the sensor's output signal with a threshold level equivalent to its DC content, so that the output logic signal is at one level when the instantaneous magnitude of the sensor output signal is greater than its average value, and at a second and different logic signal level with the sensor's output signal has an instantaneous magnitude less than its average value. In addition, it is desirable to include in the sensor interface circuitry means for detecting faults in the sensor or in the interconnecting circuitry to insure reliable operation. A typical crankshaft position sensor circuit which provides a stable cyclical output signal from a variable reluctance transducer and additionally detects improper sensor operation is shown is U.S. Pat. No. 5,012,207.

SUMMARY OF THE INVENTION

It is a first aspect of the present invention to convert the time-varying signal from a source, such as a variable reluctance sensor, into an output signal of controlled amplitude while accurately compensating for variations in the internal resistance of the source due to temperature changes or other causes.

It is another aspect of the invention to insure the integrity of a source of signals by continually measuring its internal resistance and generating a signal indicating a fault condition whenever the measured internal resistance departs from a predetermined acceptable range of values.

It is a related aspect of the present invention to enhance the reliability and accuracy of a sensor which provides digital control signals to a microprocessor or the like and to do so with a minimum number of low cost components.

The present invention employs an operational amplifier whose input is connected to a sensor or other signal source by means of a low-pass filter and which generates an offset signal having a magnitude indicative of the internal resistance of the sensor. A polarity-sensing comparison is employed to compare the sensor signal with the offset signal produced by the operational amplifier to generate the desired logic-level timing signal. A second comparison circuit continuously monitors the offset signal produced by the operational amplifier and generates a fault-indicating signal whenever the amplitude of the offset signal deviates from a predetermined range, thereby insuring that the sensor is properly connected and is operating normally.

DESCRIPTION OF THE PREFERRED EMBODIMENT

Figure 1:
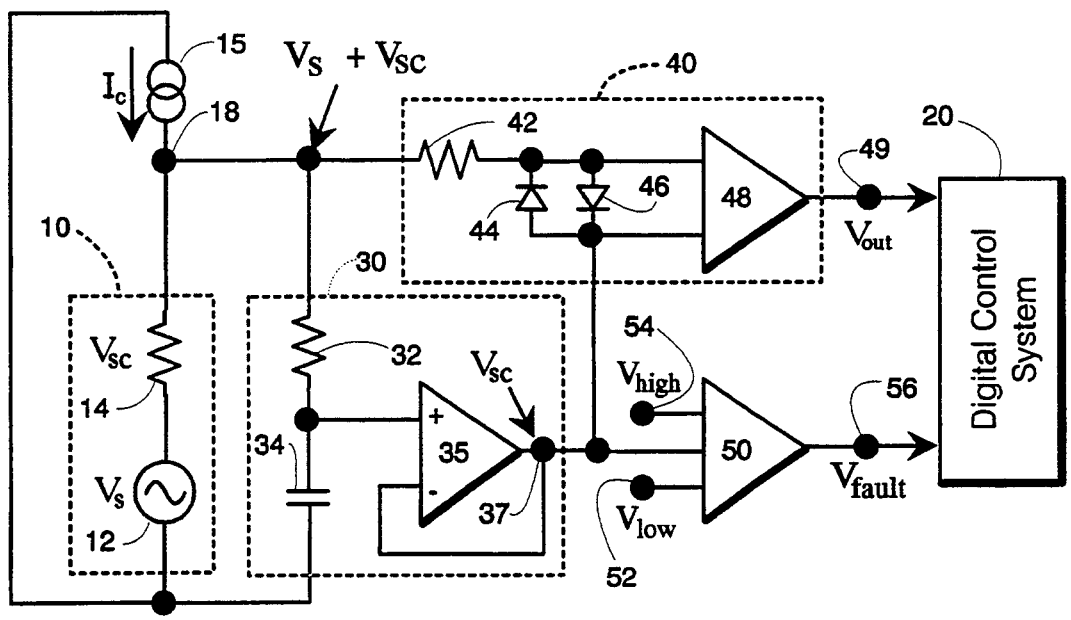
FIG. 1 is schematic diagram of the preferred embodiment of the invention.

The embodiment shown in FIG. 1 interconnects a source of time-varying signals, indicated at 10, with a digital control system 20. The source 10 may take a variety of forms which may be represented by an equivalent circuit consisting of an idealized signal source 12 connected in series with an internal resistance 14.

A current source 15 is connected to induce a substantially constant current flow through the source 10, and an DC amplifier circuit 30 is used to derive an offset voltage $V_{sc}$ from the output from the source 10 appearing at terminal 18. The magnitude of the offset voltage $V_{sc}$ serves as a measurement of the internal resistance of the source 10. The DC amplifier 30 incorporates a low-pass filter circuit consisting of resistor 32 and capacitor 34 connected in series across the source 10. The junction of resistor 32 and capacitor 34 is connected to the positive input of an operational amplifier 35, whose output is directly connected to its negative input to provide unit gain. Because the amplifier is bandwidth-limited and responds only to very low frequencies, the offset signal $V_{sc}$ appearing at the amplifier output terminal 37 corresponds to the DC component of the voltage across source 10 and has a magnitude directly related to the magnitude of the internal resistance 14 of source 10.

A first comparator circuit 40 compares the output signal from the source 10 with the offset signal magnitude $V_{sc}$ produced by the operational amplifier 35. The comparator 40 produces a two-state output signal having an amplitude indicating the polarity of the difference between the instantaneous amplitude of the signal from source 10 and $V_{sc}$, which represents the sensor signal's average value or DC content.

The comparator circuit 40 includes a polarity detection circuit consisting of a current limiting resistor 42 connected in series with the parallel combination of two diodes 44 and 46. Diodes 44 and 46 are poled in opposite directions so that current is allowed to flow in either direction through resistance 42. The amplitude-limited voltage across the two parallel diodes is then applied to the inputs of an operational amplifier 48 which applies a digital output voltage $V_{out}$ to terminal 49.

Figure 2:
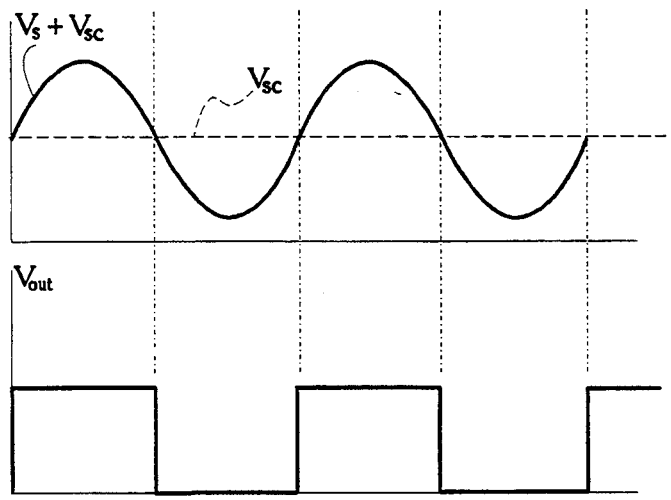
FIG. 2 is a graph showing the relationship between the time-varying sensor output signal, the DC component of the sensor output signal, and the resulting digital output signal.

The upper sinusoidal wave seen in FIG. 2 represents the voltage across the source 10 which is composed of the sum of the DC component $V_{sc}$ and the time-varying component $V_s$. The input to the comparator circuit 40, being connected between the terminal 37 and the source output terminal 18, receives an input signal equal to the time-varying component $V_s$ alone, since the DC component $V_{sc}$ at terminal 37 is subtracted from the source voltage at terminal 18. As a consequence, the input signal applied to the comparator 40 is largely immune to variations in the internal resistance 14 of the source 10, variations which might otherwise cause undesirable timing errors. The output signal $V_{out}$, whose waveshape is seen at the bottom of FIG. 2, exhibits level transition when the output source signal crosses the offset level $V_{sc}$ established by the DC amplifier 35, and the timing of these transitions is independent of the internal resistance 14 which, in practice, may vary substantially with changes in ambient temperature or other causes.

In many applications, undetected sensor malfunctions can cause serious problems. Accordingly, the arrangement seen in FIG. 1 includes a second comparator circuit illustrated by the three-input operational amplifier 50 which monitors the internal resistance 14 of the connected source 10. One input to amplifier 50 is connected to terminal 37, the output of the DC amplifier 40, and accordingly receives a signal indicative of the value of the internal resistance 14 within the source 10. The second and third inputs 52 and 54 are respectively connected to sources of reference potentials $V_{low}$ and $V_{high}$ which establish the limits of an acceptable range of internal resistance values. Amplifier 50 delivers a logic signal $V_{fault}$ to its output terminal 56 which is at a first level during normal operation but which switches to a second level indicative of a trouble condition whenever the voltage $V_{sc}$ exceeds $V_{high}$ (which may indicate an open circuit condition caused by the disconnection of the sensor) or falls below $V_{low}$ (which may indicate that the sensor has been short-circuited).

The logic level signals at output terminals 49 and 56 may be applied directly to the inputs of a suitable digital control system indicated at 20, such as the data port pins of an integrated circuit microprocessor. It may be noted that the interface circuitry is constructed entirely of conventional, low-cost components, provides the necessary voltage levels required by the digital control system 20, and substantially improves the accuracy and integrity of the source device in interfaces to that digital system.

It is to be understood that numerous modifications may be made to the specific physical structures and methods of manufacture which have been described above without departing from the true spirit and scope of the invention.

What is claimed is:

1. Apparatus for compensating for variations in the internal resistance of a signal source comprising, in combination,
    a current source connected to pass a substantially constant current through said signal source,
    a bandwidth-limited operational amplifier having an input connected to said signal source, having an output for delivering an offset signal, and having a negative feedback connection between said input and said output such that said amplifier exhibits unit gain whereby the magnitude of said offset signal is equal to the magnitude of the direct current component of the signal produced by said signal source,
    a utilization circuit,
    an output circuit for effectively connecting said utilization circuit between said signal source and the output of said bandwidth-limited amplifier whereby said utilization circuit is supplied with only the time-varying component of the signal from said source, and
    means responsive to said offset signal for indicating that the magnitude of said offset signal is outside a predetermined range of acceptable magnitudes.

2. Apparatus for compensating for variations in the internal resistance of a signal source comprising, in combination,
    a current source connected to pass a substantially constant current through said signal source,
    a bandwidth-limited operational amplifier having an input connected to said signal source, having an output for delivering an offset signal, and having a negative feedback connection between said input and said output such that said amplifier exhibits unit gain whereby the magnitude of said offset signal is equal to the magnitude of the direct current component of the signal produced by said signal source,
    a utilization circuit, and
    an output circuit for effectively connecting said utilization circuit between said signal source and the output of said bandwidth-limited amplifier whereby said utilization circuit is supplied with only the time-varying component of the signal from said source.

3. Apparatus as set forth in claim 2 further comprising means responsive to said offset signal for indicating that the magnitude of said offset signal is outside a predetermined range of acceptable magnitudes.

4. Apparatus as set forth in claim 2 wherein said bandwidth-limited amplifier comprises a high-gain operational amplifier having a negative feedback gain limiting circuit and a capacitive input circuit for passing only frequencies which are substantially lower than the lowest frequency of said time-varying component.

5. Apparatus as set forth in claim 4 wherein said output circuit comprises an output resistance connected in a series with the parallel combination of two diodes, said diodes being poled in opposing directions to permit current to flow in either direction through said output resistance, and an output amplifier having its input terminals connected across said parallel combination of diodes.

6. Sensing apparatus for providing a binary control signal indicative of a detectable event, said apparatus comprising, in combination,
    a sensor for generating a time-varying output signal in response to said detectable event, said sensor having an internal resistance,
    a first amplifier having an input and an output,
    a bandpass filter connected to said sensor to supply the direct current component only of said time-varying signal to the input to said first amplifier whereby the output of said first amplifier produces an offset signal whose magnitude is equivalent to said direct current component,
    a level-sensing amplifier having an input and an output,
    a comparator circuit connected to said sensor and to the output of said first amplifier for subtracting said offset signal from the signal produced by said sensor to produce a difference signal, and
    means for deriving said binary control signal from said difference signal.

7. Sensing apparatus as set forth in claim 6 further comprising, in combination, a source of a reference voltage having a predetermined magnitude, and means coupled to the output of said level-sensing amplifier for generating a fault signal whenever the magnitude of said offset signal is outside a range bounded by said predetermined magnitude.

8. Sensing apparatus as set forth in claim 7 wherein generation of said fault signal indicates an open circuit condition caused by disconnection of said sensor.

9. Sensing apparatus as set forth in claim 7 wherein generation of said fault signal indicates a short circuit condition caused by a short-circuit of said sensor.

* * * * *